United States Patent
Chen et al.

(10) Patent No.: US 9,363,921 B1
(45) Date of Patent: Jun. 7, 2016

(54) FIXING MEMBER OF RACK SERVER

(71) Applicant: Super Micro Computer Inc., San Jose, CA (US)

(72) Inventors: Richard S. Chen, San Jose, CA (US); Ken-Sheng Lin, San Jose, CA (US); Kuo-Hsien Wang, San Jose, CA (US)

(73) Assignee: SUPER MICRO COMPUTER INC., San Jose, CA (US)

( * ) Notice: Subject to any disclaimer, the term of this patent is extended or adjusted under 35 U.S.C. 154(b) by 0 days.

(21) Appl. No.: 14/686,043

(22) Filed: Apr. 14, 2015

(30) Foreign Application Priority Data

Dec. 5, 2014 (TW) .............................. 103221603 U

(51) Int. Cl.
*A47B 96/06* (2006.01)
*H05K 7/14* (2006.01)
*A47B 96/07* (2006.01)
*A47B 57/36* (2006.01)

(52) U.S. Cl.
CPC .............. *H05K 7/1489* (2013.01); *A47B 57/36* (2013.01); *A47B 96/07* (2013.01)

(58) Field of Classification Search
CPC .. A47B 88/044; A47B 88/00; A47B 88/0418; H05K 7/1489
USPC ............... 248/220.21, 220.31, 224.8; 211/26, 211/175, 220.21, 220.31, 220.42, 225.21, 211/224.8; 312/319.1, 334.1, 334.4; 411/107
See application file for complete search history.

(56) References Cited

U.S. PATENT DOCUMENTS

| | | | | |
|---|---|---|---|---|
| 5,338,139 | A * | 8/1994 | Swanstrom | F16B 5/0208 411/107 |
| 5,382,124 | A * | 1/1995 | Frattarola | F16B 5/0208 411/107 |
| 5,611,654 | A * | 3/1997 | Frattarola | F16B 37/065 411/173 |
| 6,955,512 | B2 * | 10/2005 | Allen | F16B 21/186 211/26 |
| 8,235,339 | B2 * | 8/2012 | Selvidge | A47B 96/06 211/175 |
| 8,371,454 | B2 * | 2/2013 | Chen | A47B 88/044 211/26 |
| 8,967,567 | B2 * | 3/2015 | Chen | H05K 7/1489 211/192 |
| 2002/0172574 | A1 * | 11/2002 | McCormack | F16B 5/0208 411/352 |
| 2003/0019824 | A1 * | 1/2003 | Gray | A47B 57/30 211/26 |
| 2003/0063960 | A1 * | 4/2003 | Allen | F16B 5/0208 411/107 |
| 2008/0067907 | A1 * | 3/2008 | Chen | A47B 88/044 312/312 |

(Continued)

*Primary Examiner* — Kimberly Wood
(74) *Attorney, Agent, or Firm* — Chun-Ming Shih; HDLS IPR Services

(57) ABSTRACT

A fixing member (100) of a rack server includes a chassis slide assembly (200), a main body (102), and a fixing column (110). The main body (102) is disposed on an end of the chassis slide assembly (200), one side of the main body (102) is connected to a first positioning element (104), and another side of the main body (102) is connected to a second positioning element (106). The second positioning element (106) is disposed corresponding to the first positioning element (104). The fixing column (110) is disposed on the main body (102) and one end thereof is fixed onto the chassis slide assembly (200). The main body (102) is able to rotate along the fixing column (110) as an axis. The first positioning element (104) and the second positioning element (106) have different shape. Therefore, the same chassis slide assembly (200) can match a different server rack.

7 Claims, 10 Drawing Sheets

(56) References Cited

U.S. PATENT DOCUMENTS

| | | | | |
|---|---|---|---|---|
| 2008/0230496 A1* | 9/2008 | Henderson | H05K 7/1489 | 211/26 |
| 2008/0296455 A1* | 12/2008 | Brock | A47B 88/044 | 248/298.1 |
| 2009/0114785 A1* | 5/2009 | Huang | H05K 7/1489 | 248/220.31 |
| 2009/0167127 A1* | 7/2009 | Chen | A47B 88/044 | 312/334.1 |
| 2009/0250421 A1* | 10/2009 | Wang | A47B 88/044 | 211/183 |
| 2010/0200523 A1* | 8/2010 | Henderson | A47B 88/044 | 211/26 |
| 2011/0240580 A1* | 10/2011 | Yu | A47B 88/044 | 211/183 |
| 2012/0018605 A1* | 1/2012 | Lacarra | A47B 88/044 | 248/224.8 |
| 2012/0292274 A1* | 11/2012 | Lin | A47B 88/044 | 211/86.01 |
| 2013/0056432 A1* | 3/2013 | Lin | H05K 7/1489 | 211/123 |
| 2014/0363108 A1* | 12/2014 | Chen | A47B 88/044 | 384/22 |
| 2014/0363109 A1* | 12/2014 | Chen | A47B 88/044 | 384/22 |
| 2015/0048041 A1* | 2/2015 | Chuang | H05K 7/1489 | 211/175 |
| 2015/0201754 A1* | 7/2015 | Chen | A47B 88/0418 | 248/219.3 |

* cited by examiner

FIXING MEMBER OF RACK SERVER

BACKGROUND

1. Technical Field

The technical field relates to a fixing member, particularly to a fixing member of a rack server with a large flexibility in use.

2. Related Art

A server is a core computer used to serve all other computers in the network system and provides hard disk and printing functions, as well as sharing all the resources in the network with every user. Therefore, a server is a replaceable computer system which can work independently. A common configuration of the server system is installing a plurality of hard disks in the chassis of the server, and a plurality of chassis is integrally arranged on a rack, thereby forming a rack type sever with stacked and serially-linked chassis.

However, since the attraction force of the magnets is limited, the magnets easily fall apart, causing the circuit modules to detach from one another when there many circuit modules are needed to be connected together, creating inconvenience in using and teaching.

A conventional means for fixing the server chassis in the rack is locking the chassis on the inner support of the slide, and locking or hooking the outer support of the slide to the fixing hole of the rack so as to fix the outer support of the slide to the rack. Then, the inner support is assembled to the outer support to allow the inner support to slide relative to the outer support. Finally, the inner support and the chassis slide to a fixed position, thereby fixing the chassis to the rack. However, the fixing hole of the rack varies in shape and size, such as a square shape or a round shape, which prohibits the outer support of the same slide from fitting into all racks, largely limiting the slide's flexibility and inconvenience in use.

BRIEF SUMMARY

The purpose of a preferred embodiment of the present invention is to provide a fixing member of a rack server, and thus the same chassis slide assembly can match with different server racks.

In order to achieve the aforementioned goal, the preferred embodiment of the present invention provides a fixing member of a rack server, which can be used with a rack provided with a plurality of rack fixing holes. The fixing member includes a chassis slide assembly, a main body, and a fixing column. The main body is disposed on an end of the chassis slide assembly, one side of the main body is connected to a first positioning element, and another side of the main body is connected to a second positioning element. The second positioning element is disposed corresponding to the first positioning element. The fixing column is disposed on the main body and one end thereof is fixed onto the chassis slide assembly. The main body is able to rotate along the fixing column as an axis to switch a relative position of the first positioning element and the second positioning element, wherein the first positioning element and the second positioning element have different shape.

Preferably, the main body further comprises a fixing tube. The fixing column includes an elastic element. The fixing column penetrates the main body through the fixing tube and is fixed to the chassis slide assembly. The elastic element is sleeved on the fixing column and accommodated into the fixing tube. The main body further comprises at least one positioning pillar. The at least one positioning pillar protrudes from a surface of the main body and is disposed on a side of the fixing column, and thereby being positioned with the chassis slide assembly having at least one positioning hole opened thereon.

Preferably, the first positioning element further comprises a buckling element and a through hole, the through hole penetrates the first positioning element in a direction perpendicular to the fixing column, and one end of the buckling element movably protrudes the through hole. Two ends of the buckling element further include a protruding part respectively, two limit slots are formed on the first positioning element corresponding to two protruding parts, the two protruding parts restrict movement of the buckling element in the two limit slots.

The preferred embodiment of the present invention further has the following functions: By using a single fixing member with a first positioning element and a second positioning element which have different shapes, different rack fixing holes can also be matched with the same fixing member, and the same fixing member can also be fixed to different racks. The operation of the single fixing member is simple and easy, and the main body is able to rotate along the fixing column as an axis to switch a relative position of the first positioning element and the second positioning element to match the shape of the rack fixing hole, thereby improving flexibility in use.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 1:
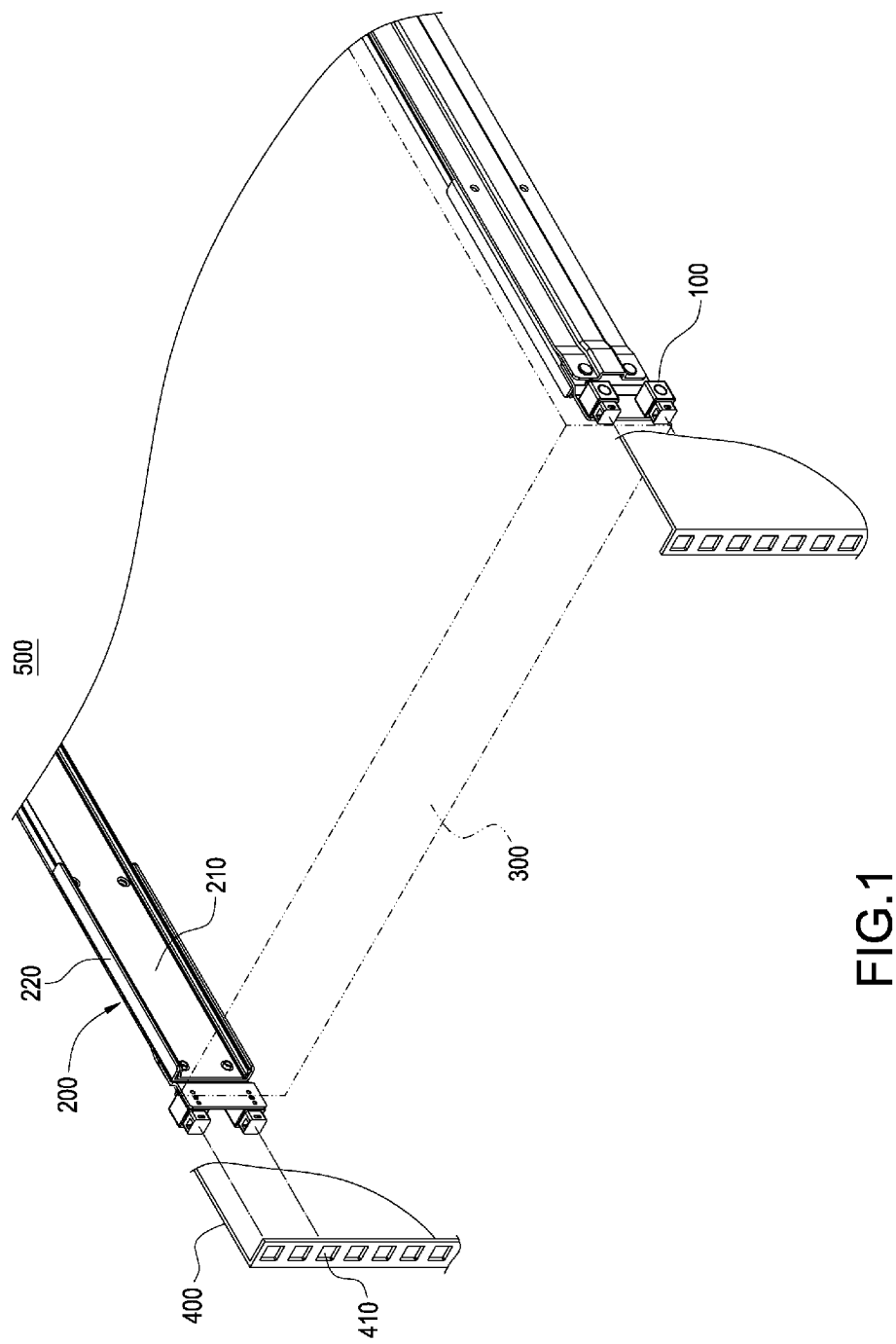
FIG. 1 is an exploded view of a preferred embodiment of the rack server and the fixing member thereof when in using according to the present invention.
Figure 2:
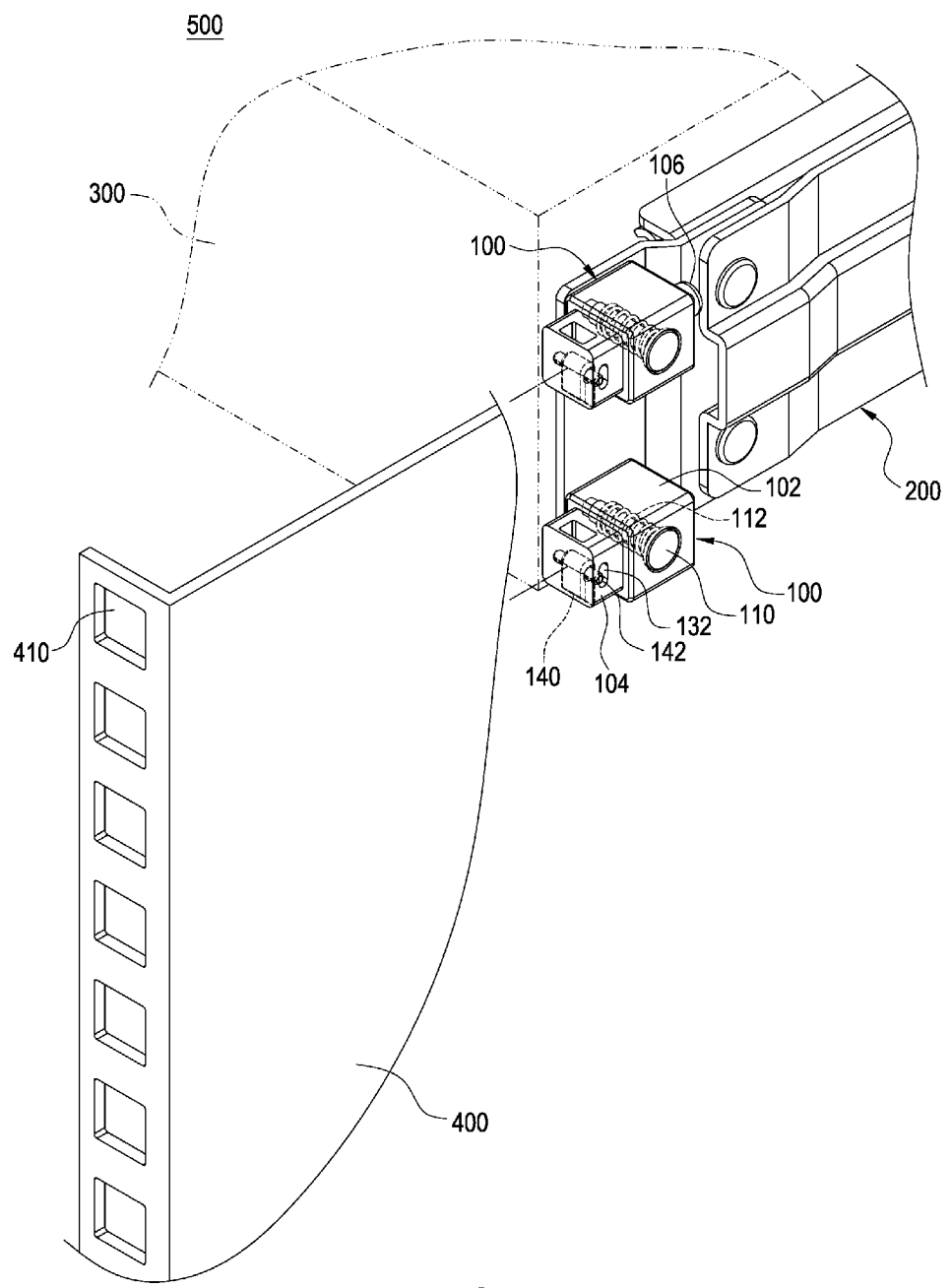
FIG. 2 is a partially enlarged view of the preferred embodiment of the rack server and the fixing member thereof when in using according to the present invention.
Figure 3:
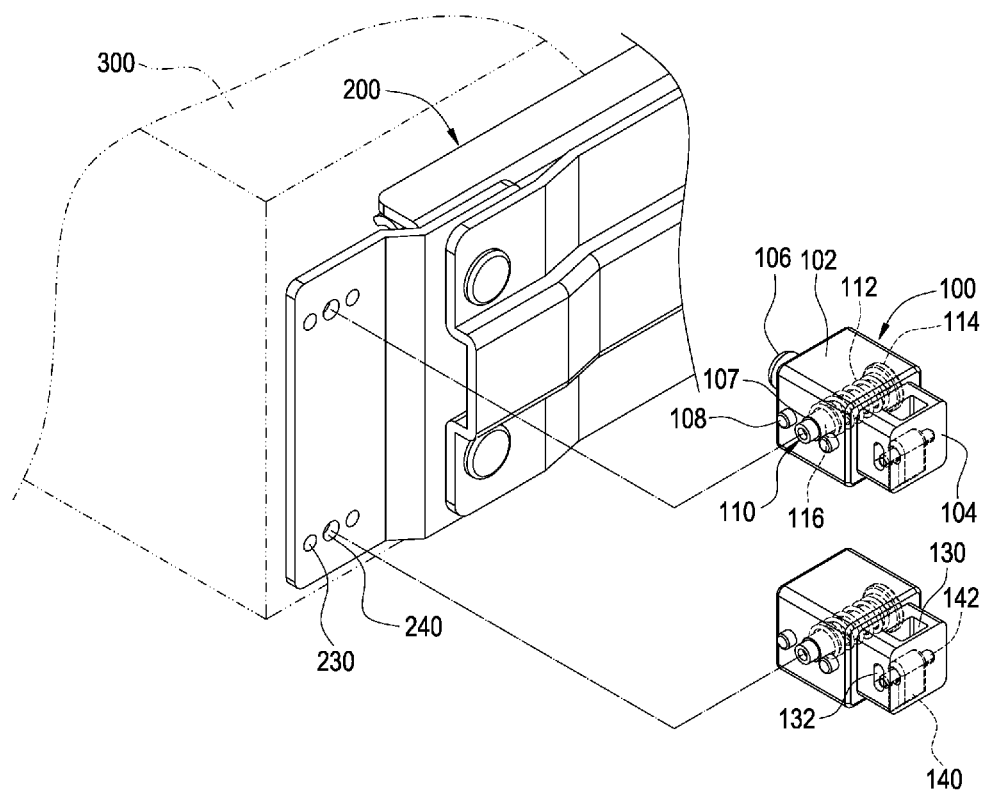
FIG. 3 is a partially disassembled view of FIG. 2.

Referring to FIGS. 1-4, as shown in FIG. 1, a fixing member 100 of a rack server is used with a rack 400 provided with a plurality of rack fixing hole 410. The chassis slide assembly 200 preferably includes an inner slide 210 connected to two side plates of the chassis 300 and an outer slide 220 fixed to the rack 400 of a server 500. The fixing member (100) preferably is fixed to one end of the outer slide 220 of the chassis slide assembly 200. In the preferred embodiments as shown in FIGS. 1-3, a single chassis 300 is used together with a pair of fixing members 100, but is not limited thereto.

The fixing member 100 includes a chassis slide assembly 200, a main body 102, and a fixing column 110. The main body 102 made of plastic, plastic steel, or any other suitable material is disposed on one end of the chassis slide assembly 200. One side of the main body 102 is connected to a first positioning element 104, and another side of the main body 102 is connected to a second positioning element 106. The second positioning element 106 is disposed corresponding to the first positioning element 104. The fixing column 110 made of metal or alloy is disposed on the main body 102 and one end thereof is fixed onto the chassis slide assembly 200. The main body 102 is able to move to cause a displacement between the fixing column 110 and the main body 102, and also able to rotate along the fixing column 110 as an axis to switch a relative position of the first positioning element 104 and the second positioning element 106, wherein the first positioning element 104 and the second positioning element 106 have different shape.

Figure 4:
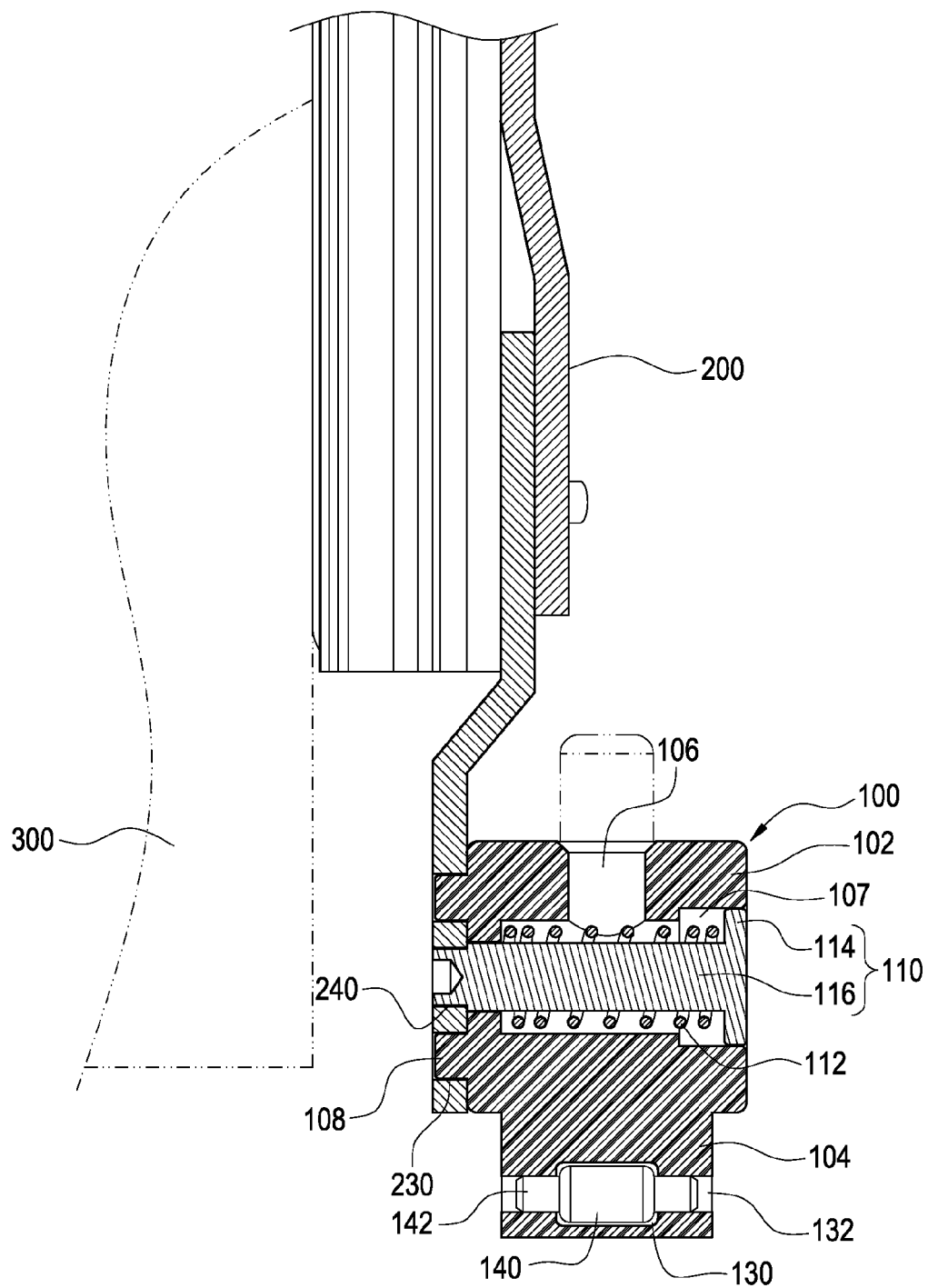
FIG. 4 is partially sectional view of FIG. 2.

In the preferred embodiment of the present invention, the shape of the first positioning element 104 is square column shape, and the second positioning element 106 is formed as round column shape or a round hole (as shown in FIG. 4). However, in other different embodiments, the first positioning element 104 is formed as round column shape or a round hole, and the second positioning element 106 is formed as square column shape, which can be changed as needed, and is not limited thereto. Besides, the shape of the first positioning element 104 and the second positioning element 106 can also be formed as other shapes depending on the shape of the rack fixing hole 410 of the rack 400. As shown in FIG. 2, when the rack fixing hole 410 of the rack 400 is formed as a square hole, the first positioning element 104 will be a square column to match to the rack fixing hole 410.

As shown in FIGS. 3 and 4, the main body 102 further includes a fixing tube 107. The fixing column 110 includes an elastic element 112. The fixing column 110 can penetrate the main body 102 through the fixing tube 107 and is fixed to one end of the chassis slide assembly 200. The elastic element 112 which is a compression spring is sleeved on the fixing column 110 and is accommodated into the fixing tube 107. The fixing column 110 further includes a head portion 114 and a pillar portion 116. The size of the head portion 114 is larger than that of the pillar portion 116, which restricts the elastic element 112 in the head portion 114 and the fixing tube 107. The elastic element 112 on the fixing column 110 can provide an elastic force to make sure the main body 102 keep engaging to the chassis slide assembly 200.

One end of the chassis slide assembly 200 includes at least one positioning hole 230 and a fixing hole 240 fixed into the fixing column 110. The main body 102 further includes at least one positioning pillar 108. The at least one positioning pillar 108 protrudes from a surface of the main body 102 and is disposed on a side of the fixing column 110, and thereby being positioned with the chassis slide assembly 200 having at least one positioning hole 230 opened thereon. In the preferred embodiment as shown in FIGS. 3 and 4, each of the fixing members 100 preferably includes two positioning pillars 108 to be positioned with two corresponding positioning holes 230, thereby stably fixing each of the fixing members 100 to the chassis slide assembly 200.

Figure 5:
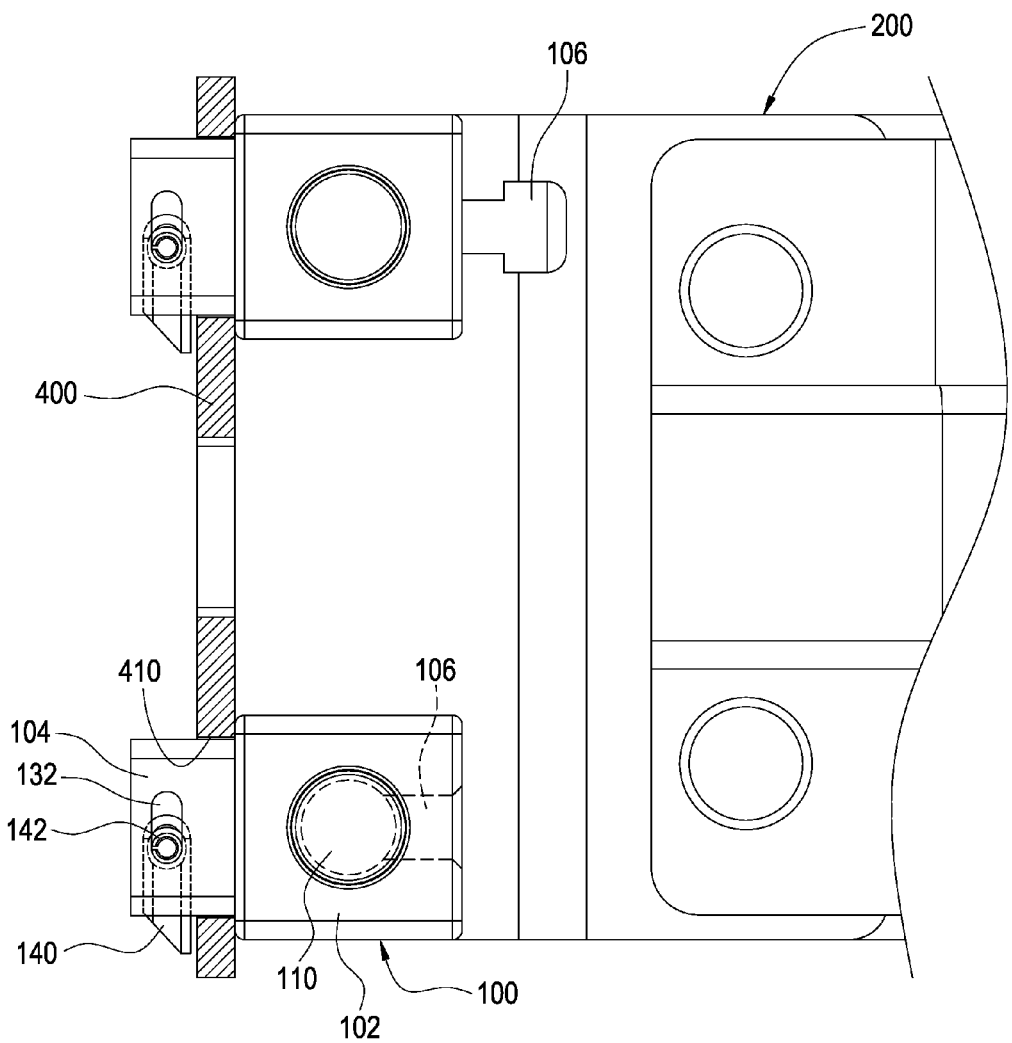
FIG. 5 is a sectional view of a first positioning element fixed to a rack fixing hole of the rack according to a preferred embodiment of the present invention.

Besides, please refer to FIG. 5, the first positioning element 104 further comprises a buckling element 140 and a through hole 130, the through hole 130 penetrates the first positioning element 104 in a direction perpendicular to the fixing column 110, and one end of the buckling element 140 movably protrudes the through hole 13 to be buckled in the rack fixing hole 410 of the rack 400, and the chassis slide assembly 200 is able to be fixed to the rack 400 accordingly. Two ends of the buckling element 140 further include a protruding part 142 respectively, two limit slots 132 are formed on the first positioning element 104 corresponding to two protruding parts 142, the two protruding parts 142 restrict movement of the buckling element 140 in the two limit slots 132, wherein a size of each of the limit slots 132 is smaller than a size of the through hole 130, and a shape of each of the limit slots 132 is oval shape.

Figure 6:
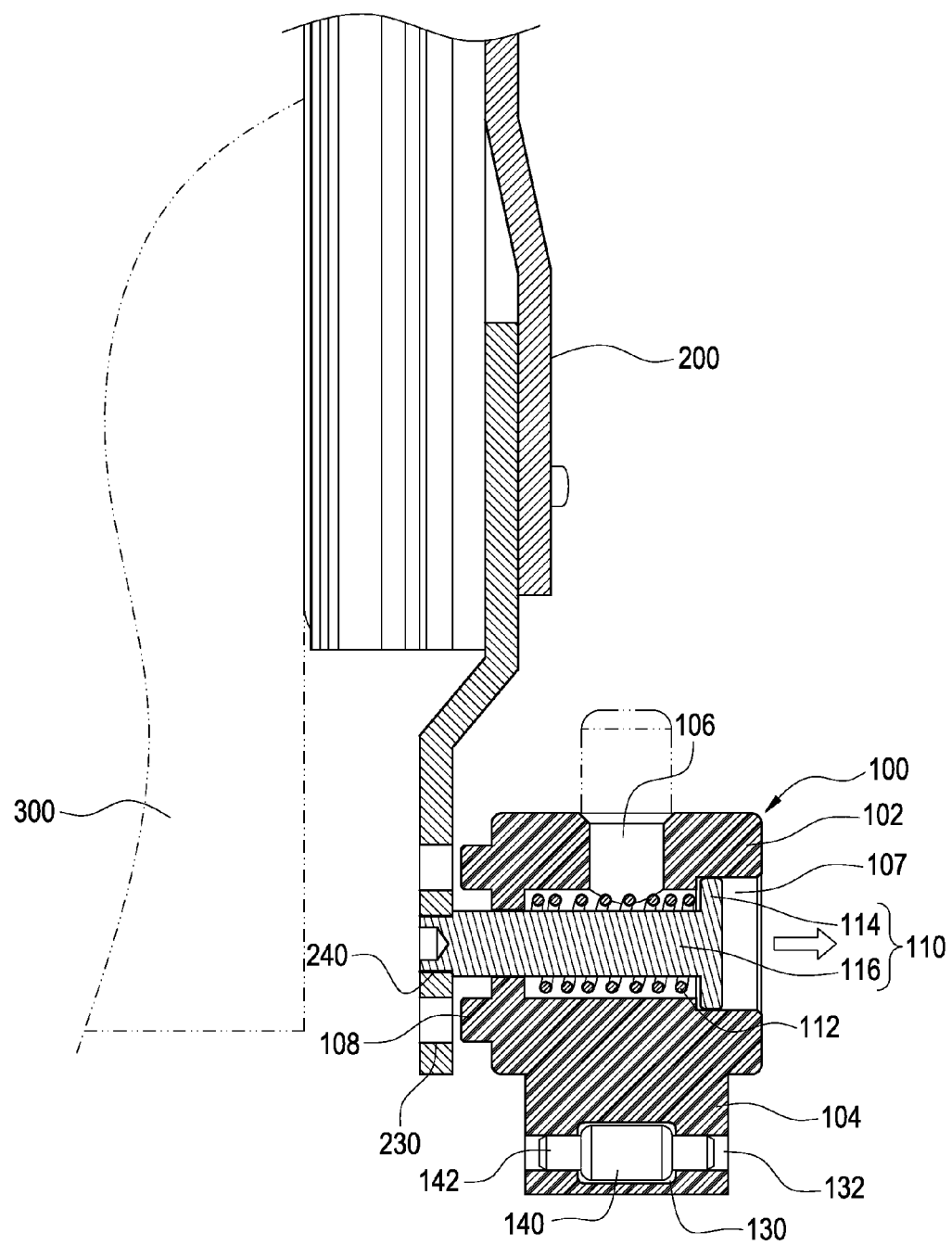
FIG. 6 is a sectional view showing a main body being able to flexibly move relative to a fixing column according to a preferred embodiment of the present invention.
Figure 7:
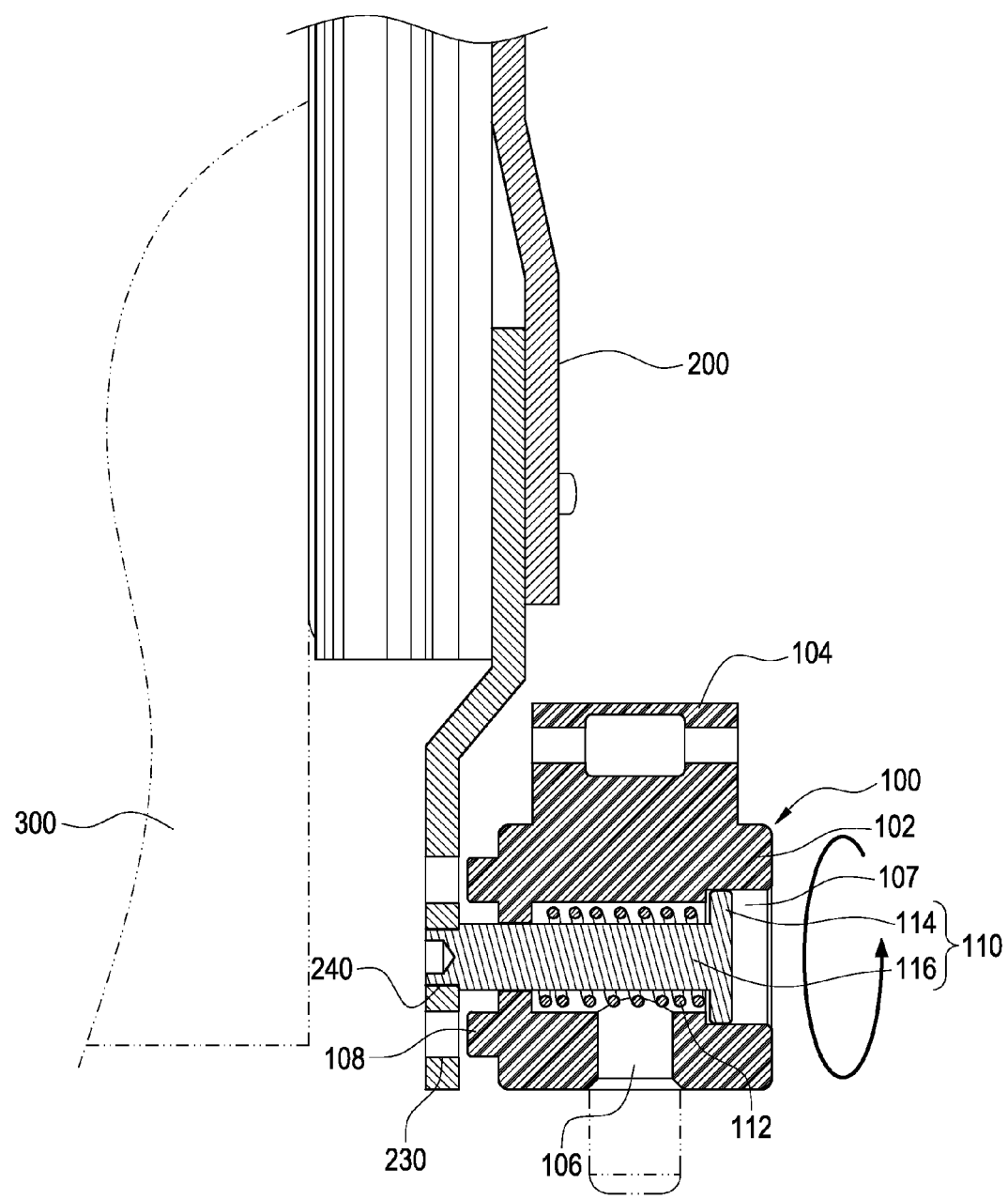
FIG. 7 is a sectional view showing the main body rotating along the fixing column as an axis according to a preferred embodiment of the present invention.
Figure 8:
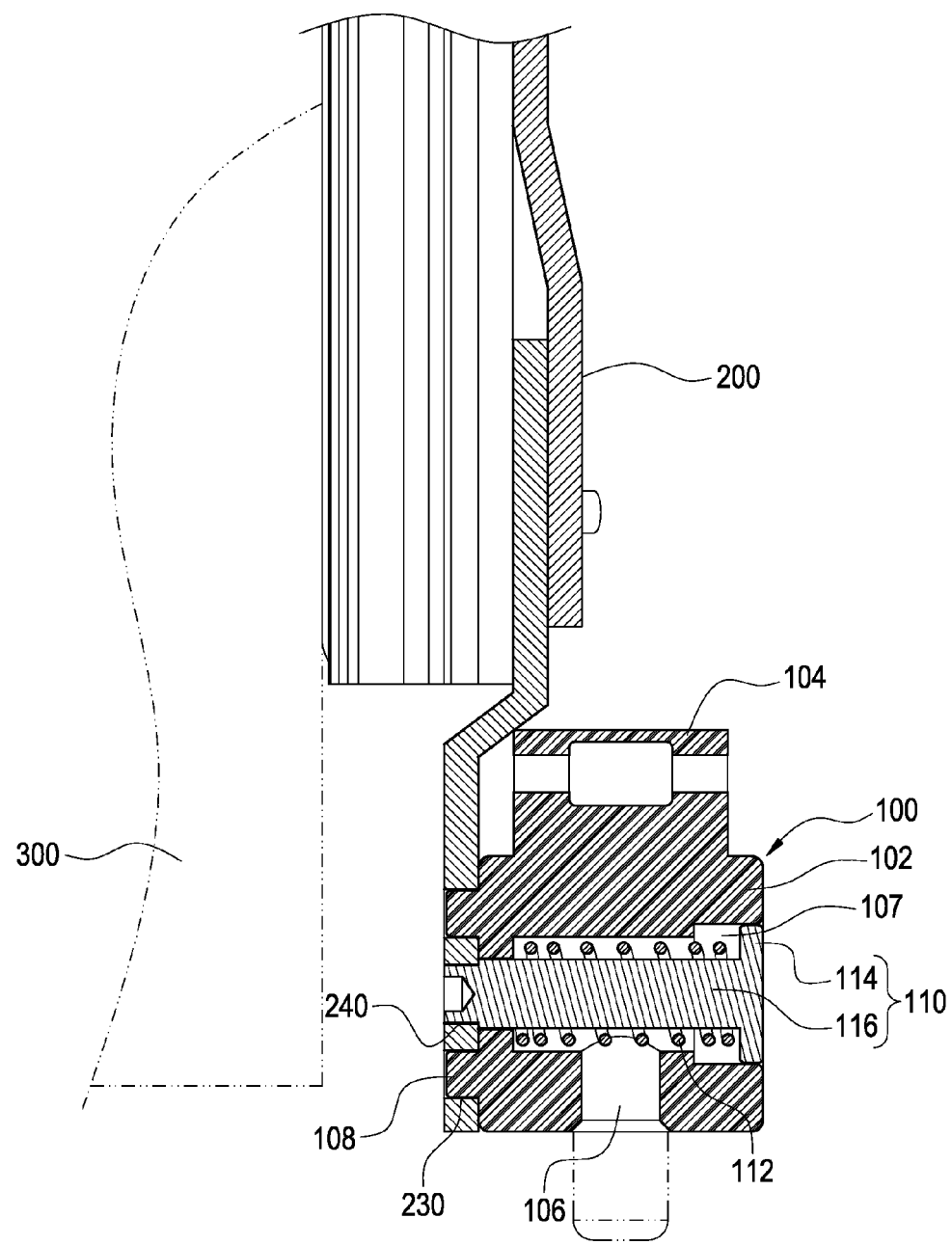
FIG. 8 is a sectional view showing the first positioning element and the second positioning element switching position with each other according to a preferred embodiment of the present invention.

The operation of the single fixing member 100 is simple and easy, and the main body 102 is able to rotate along the fixing column 110 as an axis to switch a relative position of the first positioning element 104 and the second positioning element 106 to match the shape of the rack fixing hole 410, thereby improving the flexibility in use As shown in FIGS. 6-8, the user pulls the fixing member 100 corresponding to the fixing column 110 to allow each of the positioning pillars 108 to be free from the restriction of each of the positioning holes 230, and then the main body 102 can rotate 180 degrees. Meanwhile, the second positioning element 106 exchanges the position with the first positioning element 104, and the main body 102 is released. By the elastic force provided by the elastic element 112, the main body 102 is restored, and each of the positioning pillars 108 and each of the positioning holes 230 are engaged again. Therefore, the fixing member 100 is restored to a stable connection with the chassis slide assembly 200.

Figure 9:
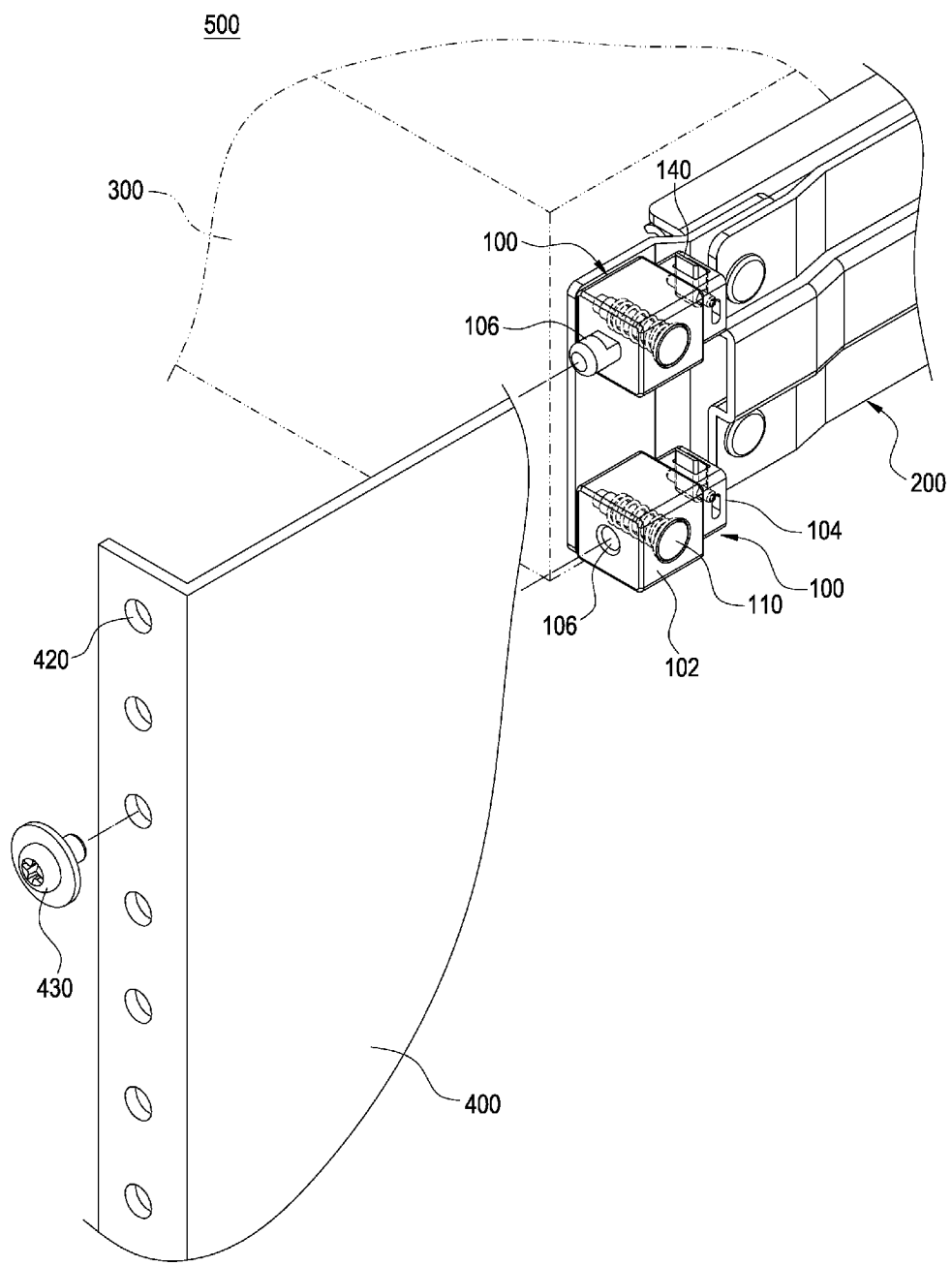
FIG. 9 is a partial exploded perspective view showing the fixing member cooperating with the fixing hole of the different rack server according to a preferred embodiment of the present invention.
Figure 10:
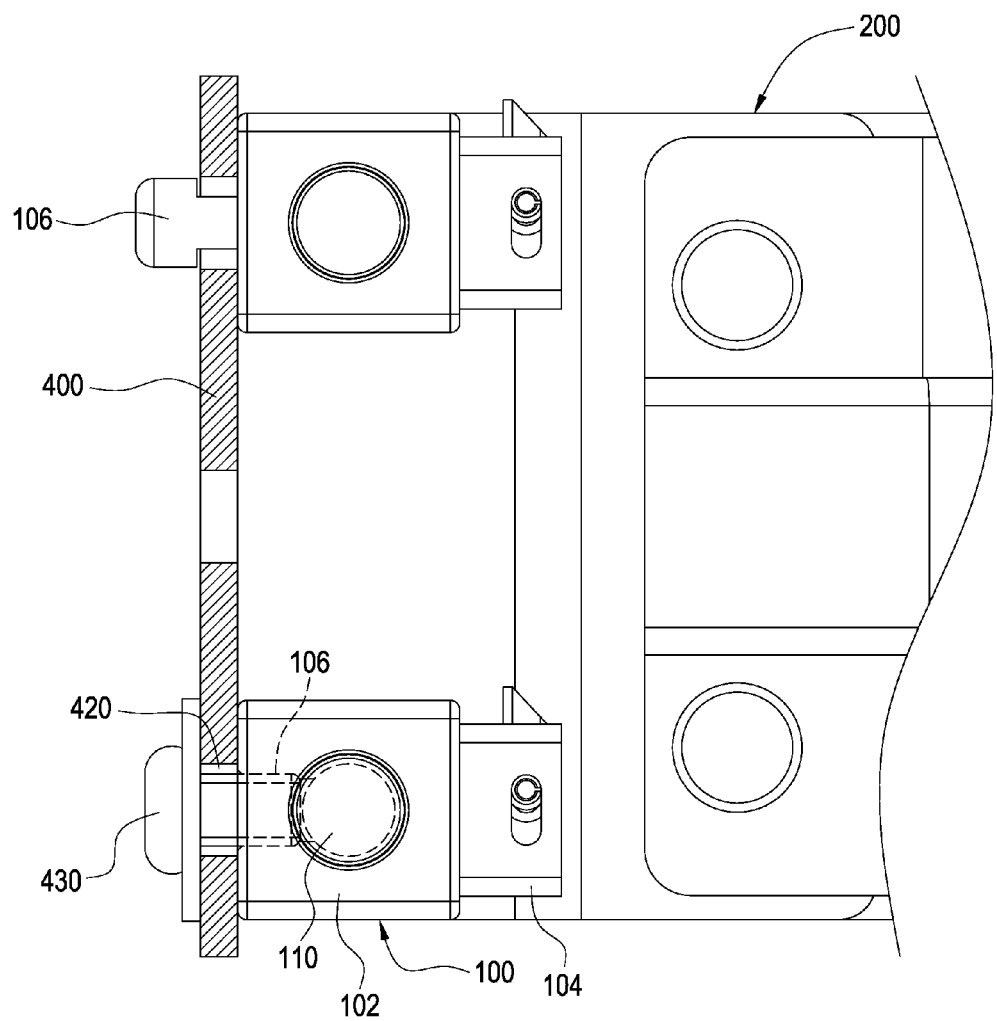
FIG. 10 is a partial sectional view of FIG. 9.

Referring to FIGS. 9 and 10, when the rack fixing hole 410 of the rack 400 is formed as a round hole, the second positioning element 106 is formed as a round column or a round hole to be fixed to the corresponding rack fixing hole 420. In a preferred embodiment as shown in FIG. 9, the second positioning element 106 is a round column protruding the main body 102 (top) or a round hole (bottom). However, no matter the second positioning element 106 is formed as a round column or a round hole, the second positioning element 106 can be fixed to the rack fixing hole 420.

When the second positioning element 106 is a round column, the round column can be directly inserted into the rack fixing hole 420 which is formed as a round hole. However, when the second positioning element 106 is a round hole, an extra fixing element 430 is needed to be fixed to the second positioning element 106. The fixing element 430 can be a screw, a bolt, a bond, a rivet, or any other suitable members, and is not limited thereto. In other words, the fixing element 430 needs to penetrate the rack fixing element 420 of the rack 400, and then is fixed to the second positioning element 106 to achieve the goal of fixing the rack 400.

By using a single fixing member 100 with a first positioning element 104 and a second positioning element 106 which respectively have different shapes, different rack fixing holes 410/420 can also be matched with the same fixing member 100, and the same fixing member 100 can also be fixed to different racks 400, thereby improving the using flexibility.

Although the present invention has been described with reference to the foregoing preferred embodiments, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. A fixing member (100) of a rack server used with a rack (400) provided with a plurality of rack fixing hole (410), the fixing member (100) comprising:
   a chassis slide assembly (200);
   a main body (102) disposed on an end of the chassis slide assembly (200), one side of the main body (102) being connected to a first positioning element (104), another side of the main body (102) being connected to a second positioning element (106), wherein the second positioning element (106) is disposed corresponding to the first positioning element (104); and
   a fixing column (110) disposed on the main body (102) and one end thereof being fixed onto the chassis slide assembly (200), the main body (102) being able to rotate along the fixing column (110) as an axis to switch a relative position of the first positioning element (104) and the second positioning element (106), wherein the first positioning element (104) and the second positioning element (106) have different shape,
   wherein the first positioning element (104) further comprises a buckling element (140) and a through hole (130), the through hole (130) penetrates the first positioning element (104), and one end of the buckling element (140) movably protrudes the through hole (130);
   wherein two ends of the buckling element (140) further include a protruding part (142) respectively, two limit slots (132) are formed on the first positioning element (104) corresponding to two protruding parts (142), the two protruding parts (142) restrict movement of the buckling element (140) in the two limit slots (132).

2. The fixing member according to claim 1, wherein the first positioning element (104) is formed as square column shape, the second positioning element (106) is formed as round column shape or a round hole.

3. The fixing member according to claim 1, wherein the first positioning element (104) is formed as round column shape or a round hole, the second positioning element (106) is formed as square column shape.

4. The fixing member according to claim 1, wherein the main body (102) further comprises a fixing tube (107), the fixing column (110) includes an elastic element (112), the fixing column (110) penetrates the main body (102) through the fixing tube (107) and is fixed to the chassis slide assembly (200), the elastic element (112) is sleeved on the fixing column (110) and accommodated into the fixing tube (107).

5. The fixing member according to claim 4, wherein the main body (102) further comprises at least one positioning pillar (108), the at least one positioning pillar (108) protrudes from a surface of the main body (102) and is disposed on a side of the fixing column (110), and thereby being positioned with the chassis slide assembly (200) having at least one positioning hole (230) opened thereon.

6. The fixing member according to claim 4, wherein the fixing column (110) further comprises a head portion (114) and a pillar portion (116), a size of the head portion (114) is larger than that of the pillar portion (116), the elastic element (112) is restricted in the head portion (114) and the fixing tube (107).

7. The fixing member according to claim 1, wherein a size of each of the limit slots (132) is smaller than a size of the through hole (130), and a shape of each of the limit slots (132) is oval shape.

\* \* \* \* \*